US006881950B2

United States Patent
Schlaf et al.

(10) Patent No.: US 6,881,950 B2
(45) Date of Patent: Apr. 19, 2005

(54) METHOD FOR PRODUCING A THREE-DIMENSIONAL MACRO-MOLECULAR STRUCTURE

(75) Inventors: Rudiger Schlaf, Lutz, FL (US); Joern Kohlscheen, Tampa, FL (US); Chris Braunagel, St. Petersburg, FL (US)

(73) Assignee: University of South Florida, Tampa, FL (US)

( * ) Notice: Subject to any disclaimer, the term of this patent is extended or adjusted under 35 U.S.C. 154(b) by 3 days.

(21) Appl. No.: 10/413,611

(22) Filed: Apr. 14, 2003

(65) Prior Publication Data

US 2003/0218127 A1 Nov. 27, 2003

Related U.S. Application Data

(60) Provisional application No. 60/319,181, filed on Apr. 12, 2002.

(51) Int. Cl.[7] .................................................. H01S 1/00
(52) U.S. Cl. ...................... 250/251; 435/283.1; 435/6
(58) Field of Search .................. 250/251, 307; 435/283.1, 6

(56) References Cited

U.S. PATENT DOCUMENTS 6,033,913 A * 3/2000 Morozov et al. ............. 436/86
6,350,609 B1 * 2/2002 Morozov et al. .......... 435/283.1
6,558,902 B1 * 5/2003 Hillenkamp .................... 435/6
2002/0048770 A1 * 4/2002 Morozov et al. .............. 435/6
2002/0192366 A1 * 12/2002 Cramer et al. .............. 427/180

* cited by examiner

Primary Examiner—Nikita Wells
Assistant Examiner—Anthony Quash
(74) Attorney, Agent, or Firm—Howard & Howard

(57) ABSTRACT

A method produces a three-dimensional macro-molecular structure on a substrate in a vacuum. In this method, a solution of a solvent and a macro-molecular species is provided. The solution is ionized to provide ionized molecules of the solvent and molecules of the macro-molecular species. The ionized molecules of the solvent have a first electrical charge and the molecules of the macro-molecular species have a second electrical charge equivalent to the first electrical charge. As such, the ionized molecules of the solvent and the molecules of the macro-molecular species naturally repel each other. The molecules of the macro-molecular species are deposited on the substrate in the vacuum to produce the three-dimensional macro-molecular structure.

14 Claims, 1 Drawing Sheet

METHOD FOR PRODUCING A THREE-DIMENSIONAL MACRO-MOLECULAR STRUCTURE

RELATED APPLICATIONS

This patent application claims priority to and all advantages of U.S. Provisional Patent Application No. 60/319,181, which was filed on Apr. 12, 2002.

BACKGROUND OF THE INVENTION

1. Field of the Invention

The subject invention generally relates to a method for producing a three-dimensional macro-molecular structure. More specifically, the subject invention relates to a method for producing a three-dimensional macro-molecular structure on a substrate in a vacuum from a solution of a solvent and a macro-molecular species.

2. Description of the Related Art

Due to their high molecular weight, macro-molecular species (e.g. nanocrystals, polymers, etc.) cannot be evaporated. Instead, these macro-molecular species have to processed from solution. Processing macro-molecular species from solution causes solubility problems. Processing macro-molecular species from solution also prevents assembly of the macro-molecular species in a vacuum, which is needed to obtain pure, defect-free structures.

Due to the deficiencies described above, it would be advantageous to provide a method for producing a three-dimensional macro-molecular structure on a substrate in a vacuum from a solution of a solvent and a macro-molecular species.

SUMMARY OF THE INVENTION AND ADVANTAGES

A method for producing a three-dimensional macro-molecular structure is disclosed. The three-dimensional macro-molecular structure is produced on a substrate in a vacuum that is defined within a vacuum chamber. The method includes the step of providing a solution of a solvent and a macro-molecular species. The solution is then ionized to provide ionized molecules of the solvent and molecules of the macro-molecular species. The ionized molecules of the solvent have a first electrical charge and the molecules of the macro-molecular species have a second electrical charge that is equivalent to the first electrical charge. As such, the ionized molecules of the solvent and the molecules of the macro-molecular species naturally repel each other. Once the solution is ionized, the molecules of the macro-molecular species are deposited on the substrate in the vacuum to produce the three-dimensional macro-molecular structure.

Accordingly, the subject invention provides for the production of three-dimensional macro-molecular structures on a substrate in a vacuum.

BRIEF DESCRIPTION OF THE DRAWINGS

Other advantages of the present invention will be readily appreciated as the same becomes better understood by reference to the following detailed description when considered in connection with the accompanying drawings wherein.

DETAILED DESCRIPTION OF THE PREFERRED EMBODIMENT

Referring to the Figures, a method for producing a three-dimensional macro-molecular structure on a substrate in a vacuum is disclosed. As is understood by those skilled in the art, the substrate may be any substrate that can adequately support a three-dimensional macro-molecular structure and where it is desirable to introduce a three-dimensional macro-molecular structure. An example of a suitable substrate includes, but is not limited to, a silicon wafer with patterned metal electrodes, and the like. The vacuum is defined within a vacuum chamber and is typically defined at $10^{-3}$ to $10^{-9}$ mbar.

Figure 3:
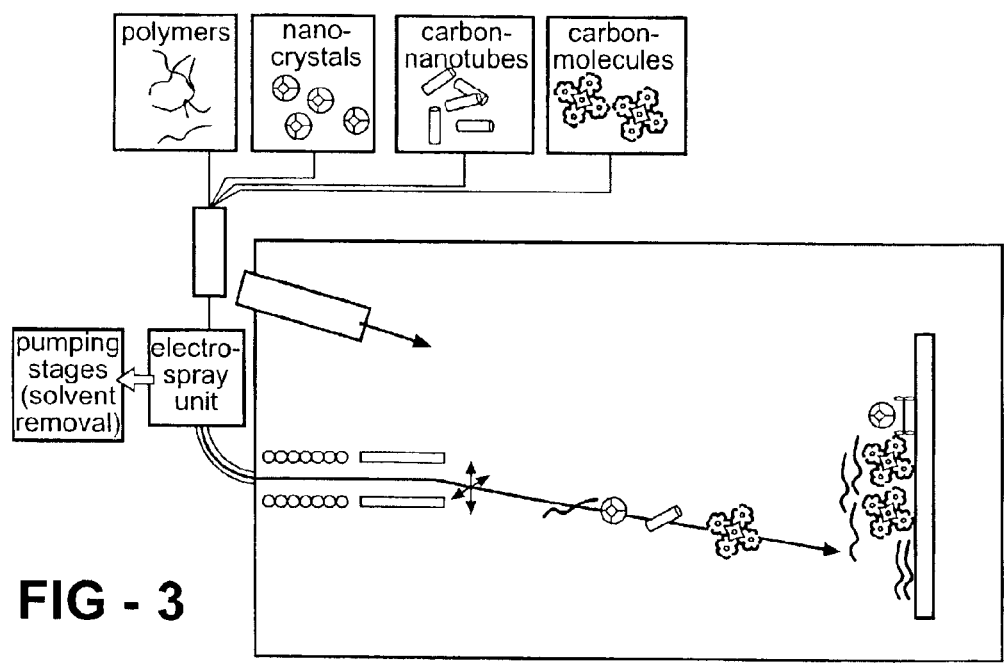
FIG. 3 is a schematic view illustrating a plurality of solutions such that molecules of different macro-molecular species can be deposited on the substrate to produce the three-dimensional macro-molecular structure on the substrate in the vacuum.

The method includes the step of providing a solution of a solvent and a macro-molecular species. To form the solution, the macro-molecular species is dissolved in the solvent. Preferably, the macro-molecular species is selected from the group consisting of polymers, nanocrystals, carbon nanotubes, nanoclusters, organic molecules, biological molecules, and combinations thereof. The solvent can be any solvent suitable for adequately dissolving the particular macro-molecular species. As such, the solvent can be organic-based or aqueous-based, or can be a blend of an organic solvent and water. Referring particularly to FIG. 3, it is also preferred that a plurality of solutions are provided with each solution including a different macro-molecular species. If necessary, these solutions can be processed through a distribution unit prior to flow to an electrospray unit. The electrospray unit is described below.

The method further includes the step of ionizing the solution. An electrical field of from 2 to 5 kV is preferred to ionize the solution. The step of ionizing the solution can occur internal or external to the vacuum chamber. For example, the solution can be injected into the vacuum. As disclosed particularly in FIG. 2, the solution can be forced through a syringe equipped with a small needle. Alternatively, the solution can be introduced external to the vacuum chamber into a region adjacent the vacuum and then drawn into the vacuum. In this alternative case, it is preferred that the solution is drawn into the vacuum by decreasing the pressure from the region adjacent the vacuum to the vacuum chamber. Decreasing the pressure from the region to the vacuum chamber causes the solution to be automatically drawn into the vacuum.

Ionizing the solution provides ionized molecules of the solvent having a first electrical charge and molecules of the macro-molecular species having a second electrical charge. The second electrical charge, i.e., the electrical charge of the molecules of the macro-molecular species, is equivalent to the first electrical charge. As such, the ionized molecules of the solvent and the molecules of the macro-molecular species naturally repel each other.

Figure 1:
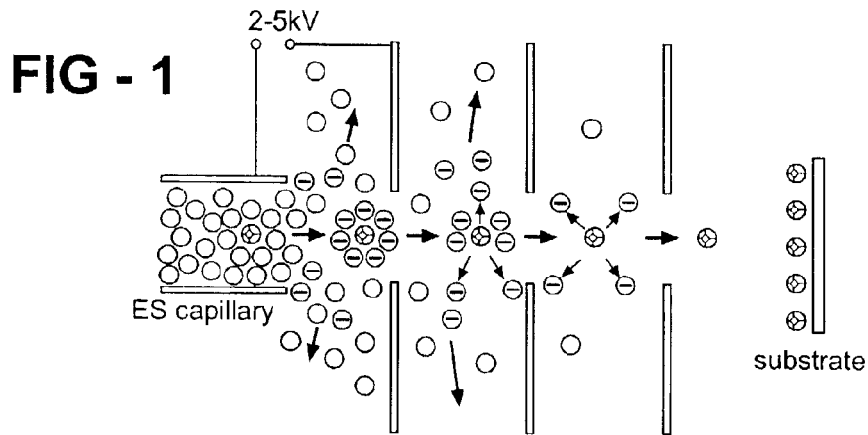
FIG. 1 is a schematic view illustrating the general principles of electrospray ionization and deposition of molecules of a macro-molecular species on a substrate in a vacuum.

It is to be understood that the solution can be ionized by any mechanism known to those skilled in the art. As non-limiting examples, the solution can be ionized by subjecting the solution to electron ionization, by subjecting the solution to electrospray ionization, and by subjecting a solid solution to matrix-assisted laser desorption/ionization. In the most preferred embodiment of the subject invention, the solution is ionized by processing the solution through the electrospray unit where the solution is subjected to electrospray ionization. The general principle of electrospray ionization is illustrated in FIG. 1 and is more specifically illustrated in FIGS. 2 and 3.

Although the ionized molecules of the solvent and the molecules of the macro-molecular species naturally repel each other, it is preferred that the repelled molecules are separated from each other, subsequent to ionization of the solution and prior to deposition of the molecules of the macro-molecular species on the substrate in the vacuum. The deposition of the molecules of the macro-molecular species is described additionally below.

To separate the repelled molecules from each other, it is preferred that a vacuum pump is utilized to pump the ionized molecules of the solvent away from the molecules of the macro-molecular species. Upon separating the ionized molecules of the solvent from the molecules of the macro-molecular species, an ionized beam of the molecules of the macro-molecular species remains.

As alluded to above, the method of the subject invention further includes the step of depositing the molecules of the macro-molecular species on the substrate in the vacuum. The deposition of the molecules of the macro-molecular species on the substrate in the vacuum produces the three-dimensional macro-molecular structure. If, for example, the substrate is the silicon wafer, then the molecules of the macro-molecular species are deposited on the silicon wafer in the vacuum to produce the three-dimensional macro-molecular structure on the silicon wafer.

Figure 2:
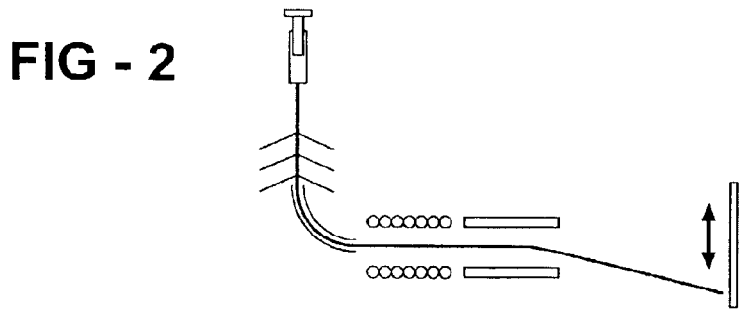
FIG. 2 is a schematic view illustrating an electrospray unit in combination with an optical device, specifically an ion optical device, and a beam deflector device in a vacuum for the controlled production of a three-dimensional macro-molecular structure on a substrate according to the subject invention, where an ionized beam of the molecules of the macro-molecular species is deflected to a specific location on the substrate during deposition.

It is the ionized beam of the molecules of the macro-molecular species that is deposited on the substrate in the vacuum. Referring particularly to FIGS. 2 and 3, the ionized beam can be focused on the substrate by certain optical devices that can be disposed within the vacuum chamber. Furthermore, the ionized beam can be deflected by various beam deflector devices that may be disposed within the vacuum chamber independent of, or in unison with, the optical devices utilized for focusing the ionized beam. The beam can be deflected to a specific location or locations on the substrate.

In addition to depositing the molecules of the macro-molecular species on the substrate in the vacuum, if desired, a metal can also be deposited on the substrate in combination with the molecules of the macro-molecular species.

Referring now the disclosures of FIGS. 1 through 3, a generic example will be described. The macro-molecular species, which is solved in a suitable solvent, is forced through the syringe. Between the needle of the syringe and a first aperture (see FIG. 1), a high voltage, preferably of from 2 to 5 kV, is applied and generates the electrical field. Due to the electrical field, strongly charged, i.e., ionized, droplets, which are molecules of the macro-molecular species coated with ionized molecules of the solvent, are created. Due to a pressure drop at an orifice, which leads to the vacuum chamber, the droplets are drawn into the vacuum chamber. The vacuum chamber includes different specifically designed pumping stages leading to a gradually decreased pressure. As the droplets proceed through the differentially pumped stages, Coulomb explosions occur due to the repulsion of equally charged molecules of the macro-molecular species and ionized molecules of the solvent. Due to their small mass, the ionized molecules of the solvent are separated by being pumped away while the molecules of the macro-molecular species, which are heavier than the solvent molecules, proceed on their original trajectory. After passing into a main chamber of the vacuum chamber, most of the molecules of solvent have been separated which leaves an ionized beam of the molecules of the macro-molecular species that can be used to deposit a film of these macro-molecular species molecules on the substrate.

Furthermore, due to the ionized nature of the ionized beam, electrostatic optics can be used to selectively focus and/or deflect the ionized beam. This type of manipulation and control of the ionized beam, i.e., focusing and deflecting, allows the controlled assembly of the molecules of the macro-molecular species in the vacuum to produce the three-dimensional macro-molecular structure on the substrate. For example, the deflection of the ionized beam moves the ionized beam such that the ionized beam can be controlled and the molecules of the macro-molecular species can be deposited on a specific location on the substrate. Thus, certain desired patterns can be formed on the substrate.

Finally, with the distribution unit and the plurality of solutions with different macro-molecular species, the method of the subject invention can deposit different macro-molecular species in one single process, which is represented schematically in FIG. 3. More specifically, different reservoirs, each with a different solution are connected to the electrospray unit. A computer, not disclosed in the Figures, interfaces with the distribution unit to switch between the different solutions thereby enabling the building, i.e., production of, a three-dimensional macro-molecular structure by computer aided design/computer aided manufacture (CAD/CAM) system in a single vacuum chamber.

The present invention has been described in an illustrative manner. Obviously, many modifications and variations of the present invention are possible in light of the above teachings, and the invention may be practiced otherwise than as specifically described within the scope of the appended claims. Furthermore, it is to be understood that the terminology that has been used is intended to be in the nature of words of description rather than of limitation.

What is claimed is:

1. A method for producing a three-dimensional macro-molecular structure on a substrate in a vacuum defined within a vacuum chamber, said method comprising the steps of:

providing a solution of a solvent and a macro-molecular species;

ionizing the solution to provide ionized molecules of the solvent having a first electrical charge and molecules of the macro-molecular species having a second electrical charge equivalent to the first electrical charge such that the ionized molecules of the solvent and the molecules of the macro-molecular species naturally repel each other;

separating the ionized molecules of the solvent from the molecules of the macro-molecular species such that an ionized beam of the molecules of the macro-molecular species remains; and deflecting the ionized beam to a specific location on the substrate to produce the three-dimensional macro-molecular structure on the substrate.

2. A method as set forth in claim 1 wherein the step of separating the ionized molecules of the solvent from the molecules of the macro-molecular species is further defined as pumping the ionized molecules of the solvent away from the molecules of the macro-molecular species.

3. A method as set forth in claim 1 further comprising the step of focusing the ionized beam prior to deflecting the ionized beam to the specific location on the substrate.

4. A method as set forth in claim 1 further comprising the step of injecting the solution into the vacuum.

5. A method as set forth in claim 1 further comprising the step of introducing the solution into a region adjacent the vacuum and drawing the solution into the vacuum.

6. A method as set forth in claim 5 wherein the step of drawing the solution into the vacuum is further defined as decreasing the pressure from the region adjacent the vacuum to the vacuum chamber such that the solution is drawn into the vacuum.

7. A method as set forth in claim 1 wherein the step of ionizing the solution is further defined as subjecting the solution to electron ionization.

8. A method as set forth in claim 1 wherein the step of ionizing the solution is further defined as subjecting the solution to electrospray ionization.

9. A method as set forth in claim 1 wherein the step of ionizing the solution is further defined as subjecting the solution to matrix-assisted laser desorption/ionization.

10. A method as set forth in claim 1 wherein the step of providing the solution of the solvent and the macro-molecular species is further defined as providing a solution of a solvent and a macro-molecular species selected from the group consisting of polymers, nanocrystals, carbon nanotubes, nanoclusters, organic molecules, biological molecules, and combinations thereof.

11. A method as set forth in claim 1 wherein the substrate is further defined as a silicon wafer and the step of deflecting the ionized beam to a specific location on the substrate is further defined as deflecting the ionized beam to a specific location on the silicon wafer to produce the three-dimensional macro-molecular structure on the silicon wafer.

12. A method as set forth in claim 1 wherein the step of providing the solution of the solvent and the macro-molecular species is further defined as simultaneously providing a plurality of solutions, with each solution including a different macro-molecular species.

13. A method as set forth in claim 12 wherein the macro-molecular species are selected from the group consisting of polymers, nanocrystals, carbon nanotubes, nanoclusters, organic molecules, biological molecules, and combinations thereof.

14. A method as set forth in claim 1 further comprising the step of depositing a metal on the substrate in combination with the molecules of the macro-molecular species.

* * * * *

UNITED STATES PATENT AND TRADEMARK OFFICE
CERTIFICATE OF CORRECTION

PATENT NO. : 6,881,950 B2
DATED : April 19, 2005
INVENTOR(S) : Rudiger Schlaf et al.

It is certified that error appears in the above-identified patent and that said Letters Patent is hereby corrected as shown below:

Title page,
Item [75], Inventor, after "Kohlscheen," delete "Tampa, FL (US)" and insert therein -- Bremen, Germany (DE) --.

Signed and Sealed this

Twenty-eighth Day of June, 2005

JON W. DUDAS
*Director of the United States Patent and Trademark Office*